United States Patent
Zhang et al.

(10) Patent No.: US 11,335,417 B1
(45) Date of Patent: May 17, 2022

(54) READ THRESHOLD OPTIMIZATION SYSTEMS AND METHODS USING MODEL-LESS REGRESSION

(71) Applicant: SK hynix Inc., Gyeonggi-do (KR)

(72) Inventors: Fan Zhang, Fremont, CA (US); Aman Bhatia, Los Gatos, CA (US); Xuanxuan Lu, San Jose, CA (US); Meysam Asadi, Fremont, CA (US); Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 17/082,838

(22) Filed: Oct. 28, 2020

(51) Int. Cl.
*G11C 11/34* (2006.01)
*G11C 16/34* (2006.01)
*G11C 16/26* (2006.01)
*G11C 16/10* (2006.01)
*G11C 16/30* (2006.01)

(52) U.S. Cl.
CPC .......... *G11C 16/3404* (2013.01); *G11C 16/10* (2013.01); *G11C 16/26* (2013.01); *G11C 16/30* (2013.01)

(58) Field of Classification Search
CPC . G11C 16/10; G11C 11/5628; G11C 11/5642; G11C 16/0483; G11C 16/12
USPC ........................................ 365/185.24, 189.15
See application file for complete search history.

(56) References Cited

U.S. PATENT DOCUMENTS

| | | | |
|---|---|---|---|
| 8,817,545 B2 | 8/2014 | Seo et al. | |
| 10,068,655 B2 | 9/2018 | Shen et al. | |
| 2009/0323422 A1* | 12/2009 | Alrod ................... | G11C 16/349 365/185.18 |
| 2020/0210831 A1* | 7/2020 | Zhang .................. | G11C 29/028 |

* cited by examiner

*Primary Examiner* — Son T Dinh
(74) *Attorney, Agent, or Firm* — IP & T Group LLP

(57) ABSTRACT

A controller optimizes a read threshold value for a memory device using model-less regression. The controller performs read operations on cells using read threshold voltage values. The controller measures probability values for the multiple read threshold voltage values, and estimates a threshold voltage distribution curve based on the multiple read threshold voltage values and the measured probability values using a set regression formula. The controller determines a read threshold voltage value corresponding to a set point on the threshold voltage distribution curve, and performs a read operation on the cells using the read threshold voltage value.

20 Claims, 10 Drawing Sheets

READ THRESHOLD OPTIMIZATION SYSTEMS AND METHODS USING MODEL-LESS REGRESSION

BACKGROUND

1. Field

Embodiments of the present disclosure relate to a scheme for optimizing read threshold values in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various read thresholds to perform read operations.

SUMMARY

Aspects of the present invention include a memory system and a method for optimizing a read threshold value using model-less regression.

In one aspect, a memory system includes a memory device including a plurality of cells and a controller. The controller performs multiple read operations on a plurality of cells using multiple read threshold voltage values, measure probability values for the multiple read threshold voltage values, estimates a threshold voltage distribution curve based on the multiple read threshold voltage values and the measured probability values using a set regression formula, determines a read threshold voltage value corresponding to a set point on the threshold voltage distribution curve, and performs a read operation on the plurality of cells using the read threshold voltage value.

In another aspect, a method for operating a memory system includes performing multiple read operations on a plurality of cells using multiple read threshold voltage values, measuring probability values for the multiple read threshold voltage values, estimating a threshold voltage distribution curve based on the multiple read threshold voltage values and the measured probability values using a set regression formula, determining a read threshold voltage value corresponding to a set point on the threshold voltage distribution curve, and performing a read operation on the plurality of cells using the read threshold voltage value.

Additional aspects of the present invention will become apparent from the following description.

DETAILED DESCRIPTION

Figure 1:
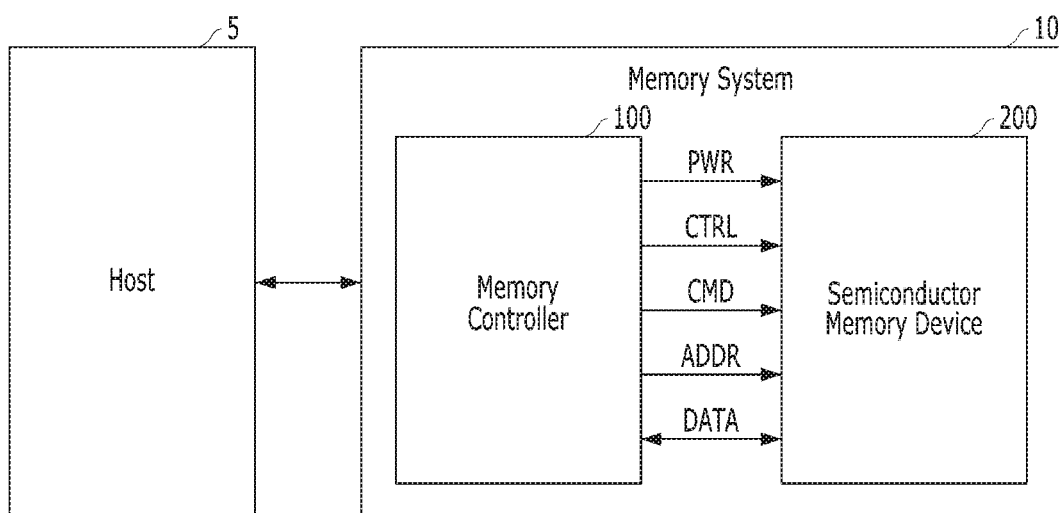
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operation of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
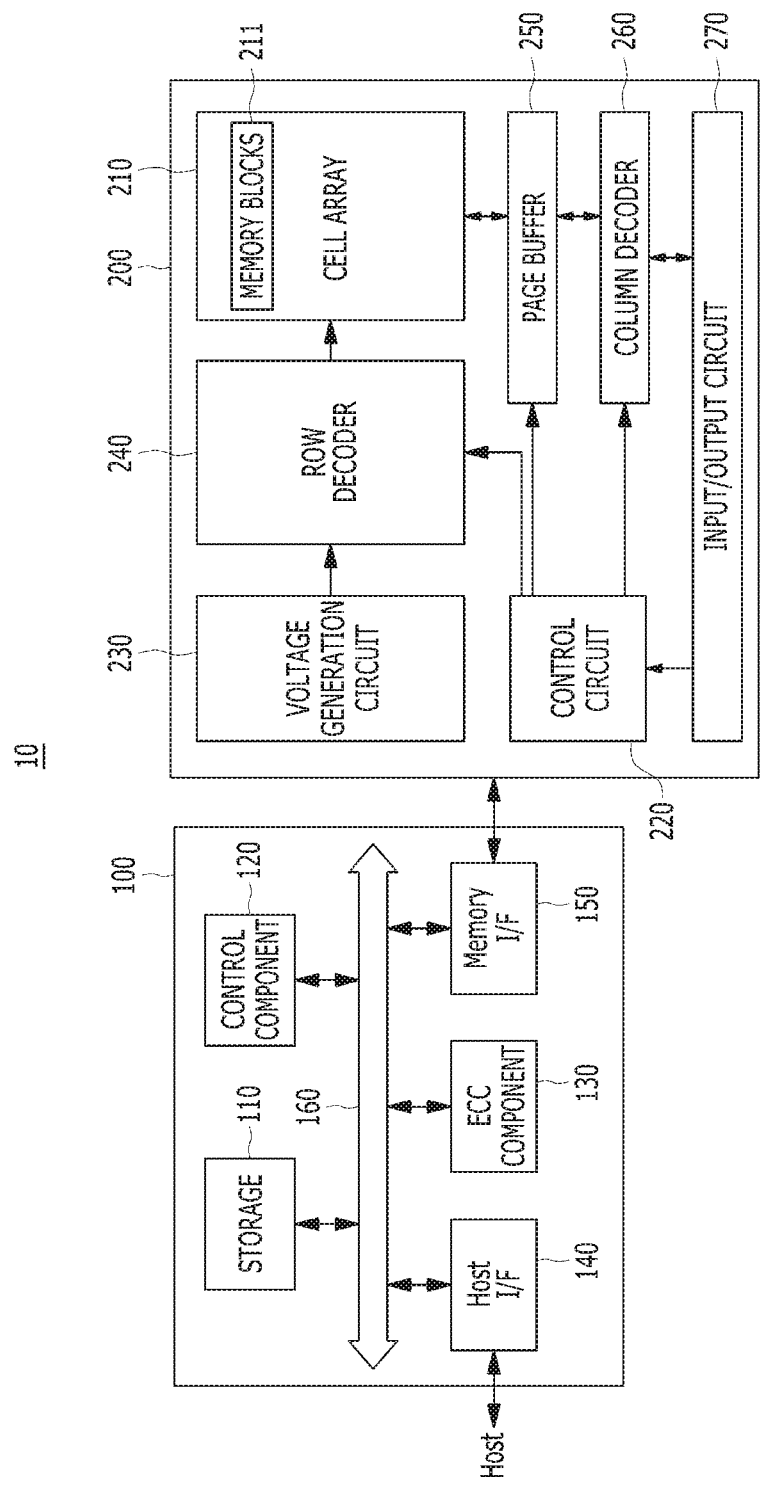
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operation of the memory system 10, and in particular a write operation and a read operation for the memory device 200, in response to a corresponding request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation on the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
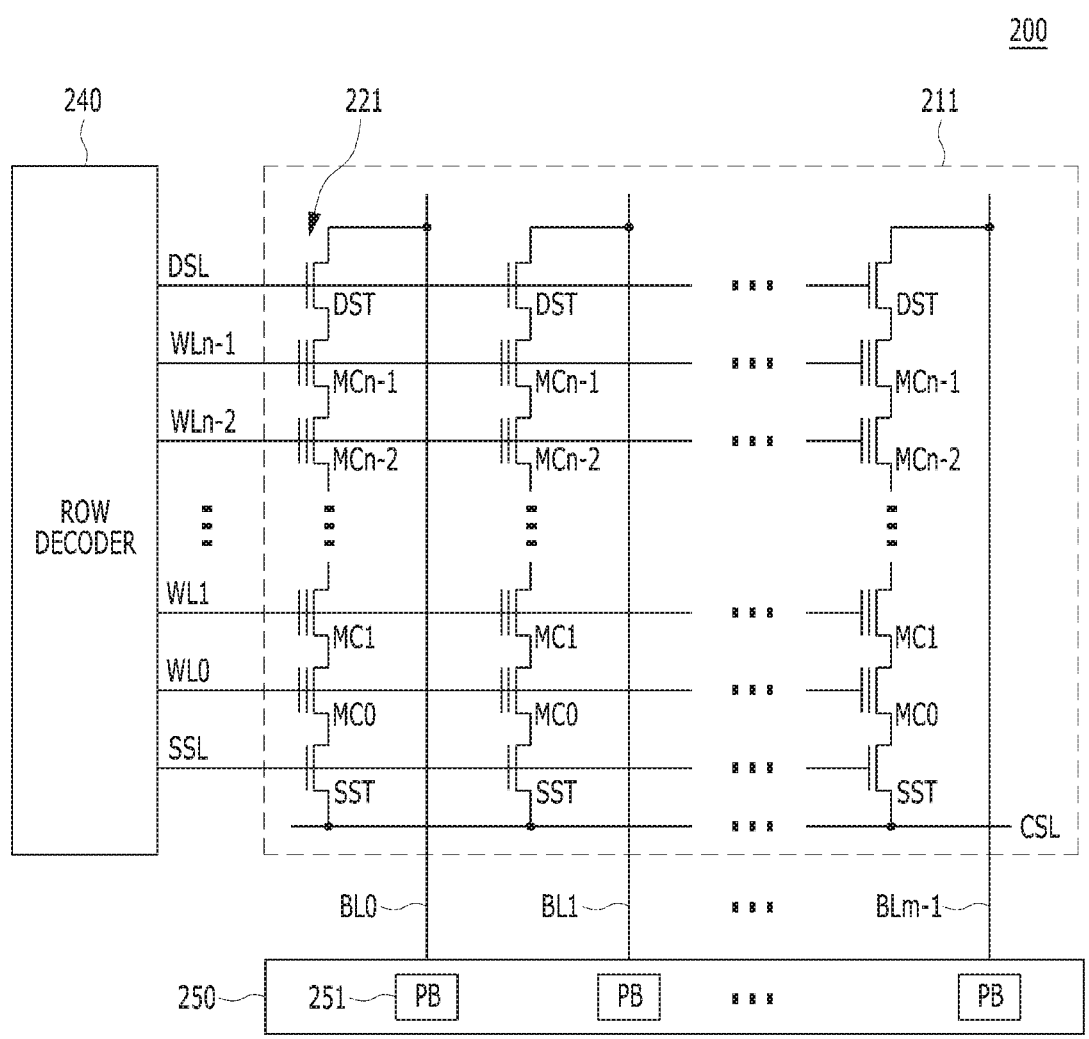
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include NAND-type flash memory cells. However, the memory blocks 211 are not limited to such cell type, but may include NOR-type flash memory cells. Memory cell array 210 may be implemented as a hybrid flash memory in which two or more types of memory cells are combined, or one-NAND flash memory in which a controller is embedded inside a memory chip.

Figure 4:
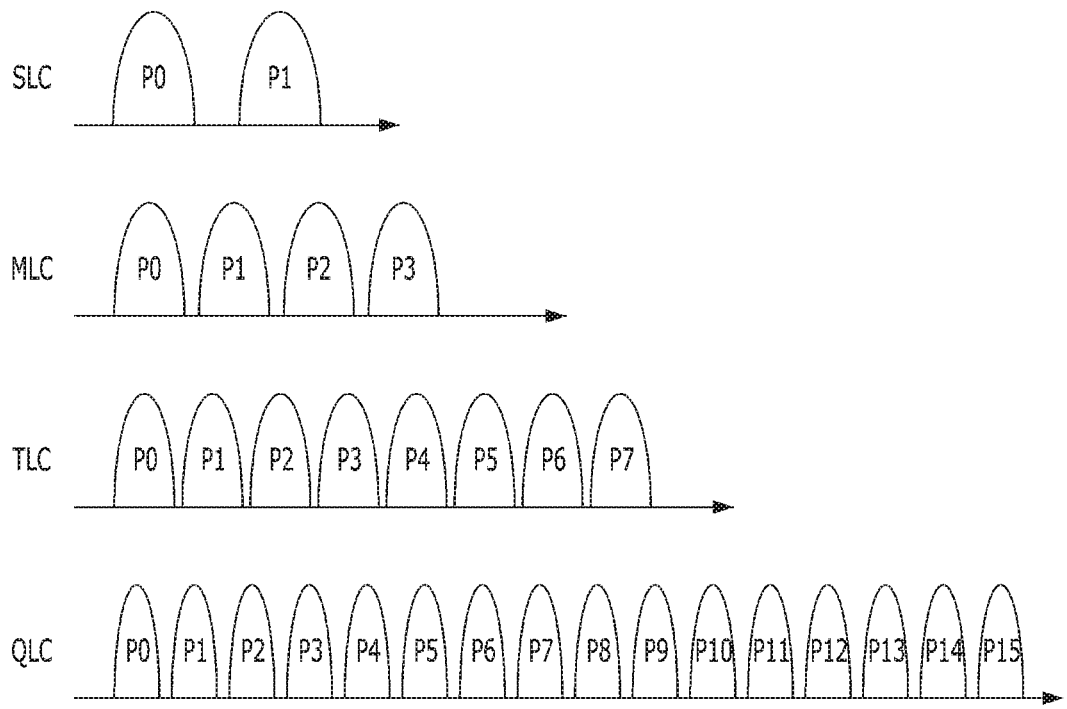
FIG. 4 is a diagram illustrating distributions of states for different types of cells of a memory device.

FIG. 4 is a diagram illustrating distributions of states or program voltage (PV) levels for different types of cells of a memory device.

As described above, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement. FIG. 4 shows the states for each of those types of cells.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Figure 5:
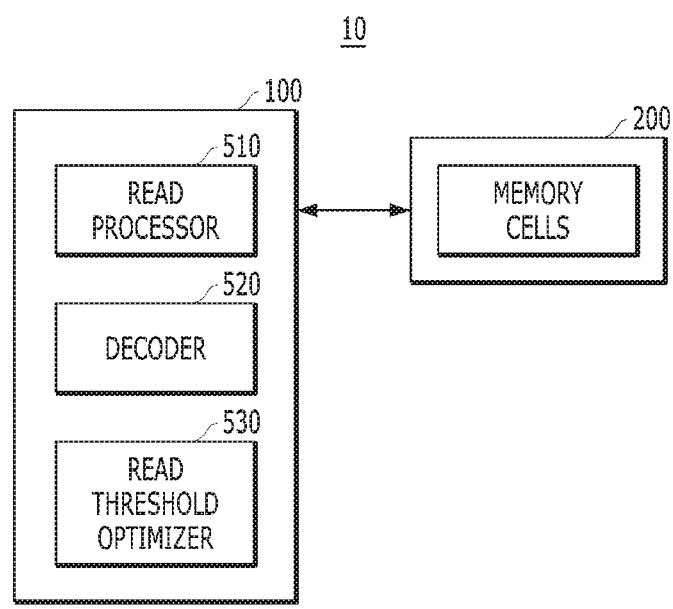
FIG. 5 is a diagram illustrating a memory system in accordance with an embodiment of the present invention.

FIG. 5 is a diagram illustrating a memory system 10 in accordance with an embodiment of the present invention.

Referring to FIG. 5, the memory system 10 may include a controller 100 and a memory device 200 coupled to the controller 100. The memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

Figure 6:
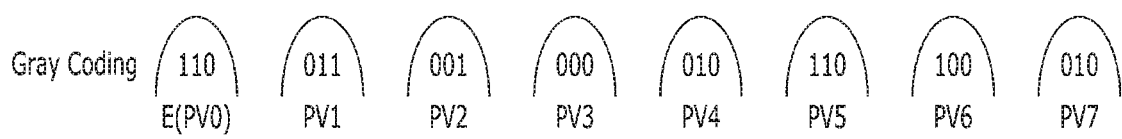
FIG. 6 is a diagram illustrating an example of Gray coding for a triple level cell (TLC).

FIG. 6 is a diagram illustrating an example of Gray coding for a triple level cell (TLC).

Referring to FIG. 6, a TLC may be programmed using Gray coding. A TLC may have 8 program states, which include an erased state E (or PV0) and first to seventh program states PV1 to PV7. The erased state E (or PV0) may correspond to "110." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 7:
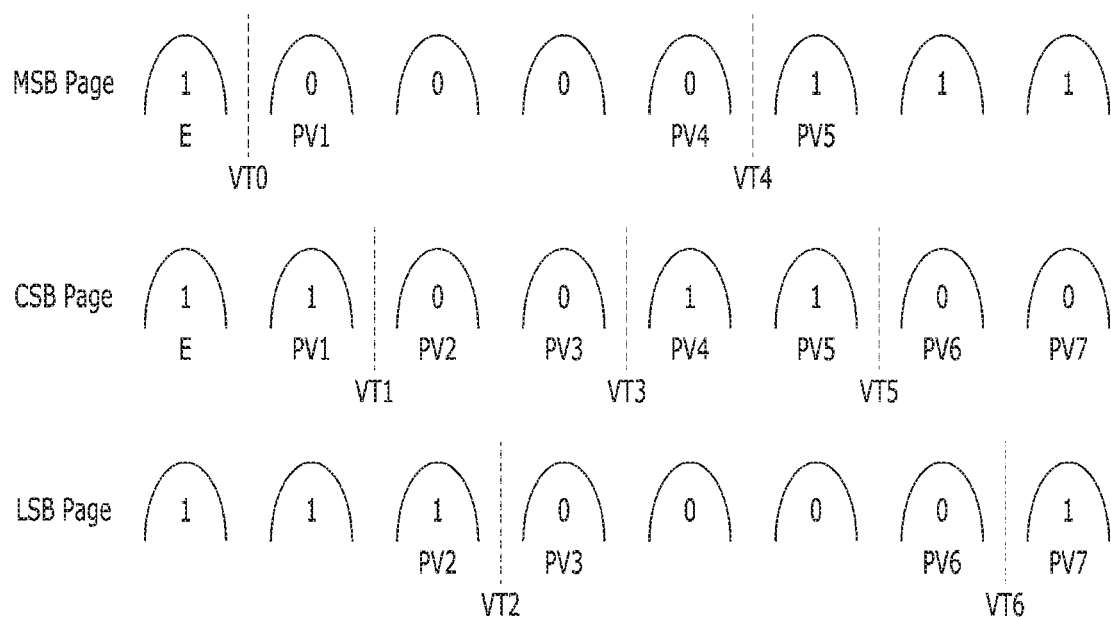
FIG. 7 is a diagram illustrating state distributions for pages of a triple level cell (TLC).

In a TLC, as shown in FIG. 7, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

Referring back to FIG. 5, the controller 100 may include a read processor 510, a decoder 520 and a read threshold optimizer 530. These components may be implemented with internal components of the control component 120 (i.e., firmware (FW)) in FIG. 2. Although FIG. 5 illustrates the read processor 510 and the read threshold optimizer 530 as different components, the read processor 510 and the read threshold optimizer 530 may be implemented as one component. Although not shown in FIG. 5, the controller 100 and the memory device 200 may include various other components as shown in FIG. 2.

Typically, model-based schemes such as a Gaussian Mixture (GM) algorithm and various curve fitting algorithms are used for read threshold optimization. Various embodiments provide a read threshold optimization scheme using model-less regression, which means that any particular model is not assumed behind the data that can be observed. The read threshold optimization scheme of the present invention does not assume any underlying NAND Vt distribution as many of the model-based schemes do. The read threshold optimization scheme is relatively easy to implement and may improve the read threshold prediction accuracy and hence improve the endurance and quality of service (QoS) of memory systems (or storage devices) (e.g., SSDs). In some embodiments, the read threshold optimization scheme estimates read threshold voltage values or read threshold (Vt) distribution and finds the minimum point on the estimate Vt distribution.

The read processor 510 may control read operations on a plurality of cells of the memory device 200. In some embodiments, the read processor 510 may perform multiple read operations (or multiple test read operations) on the plurality of cells using multiple read threshold voltage values.

In an embodiment, the read processor 510 may perform a first read operation on the plurality of cells using a first read threshold voltage value, and perform a second read operation on the plurality of cells using a second read threshold voltage value. By way of example, the first read threshold voltage value may be a successful, previously-used read threshold voltage value (i.e., a history read threshold voltage value). Such value may be a recent, or the most recent, read threshold value previously used. Previously successful read threshold voltage values may be stored and managed in a read history table as history read threshold voltage values. By way of example, the second read threshold value may be used for a read retry operation. Multiple read retry threshold voltage values may be stored in a read retry table (e.g., a high-priority read retry (HRR) table). The second read threshold value may be a first entry of the read retry table, indicating that the second read threshold value has the highest priority among all entries in the HRR table. The multiple read retry threshold voltage values in the HRR table may be arranged in order of highest priority to lowest priority.

In another embodiment, the read processor 510 may perform three read operations on the plurality of cells. In addition to using the first and second read threshold values described above, a third read threshold value may be used. The third read threshold value may be a second entry of the read retry table. That is, the third read threshold value has a lower priority rank than the second read threshold value in the HRR table.

More generally, the read processor 510 may take more than three test reads, and its threshold search accuracy improves as the number of test reads increases.

The read threshold optimizer 530 may estimate a threshold voltage distribution curve based on the multiple read threshold voltage values using a set regression formula. Further, the read threshold optimizer 530 may determine a read threshold voltage value corresponding to a set point on the threshold voltage distribution curve. The operation for determining the read threshold voltage value corresponding to the set point on the threshold voltage distribution curve is described in below.

The read processor 510 may perform a read operation on the plurality of cells using the determined read threshold voltage value. The decoder 520 may decode data associated with the read operation and determine whether or not the data was successfully decoded, i.e., whether or not the read operation succeeded. When it is determined that the read operation succeeded, the read processor 510 may end the read operation. When it is determined that the read operation failed, the read threshold optimizer 530 may perform an operation of determining another read threshold voltage value along the curve.

Read threshold optimization schemes of the controller 100 are described with reference to FIGS. 8 to 12. Two examples of an overall read threshold (Vt) distribution are illustrated in FIGS. 8 and 11.

Figure 8:
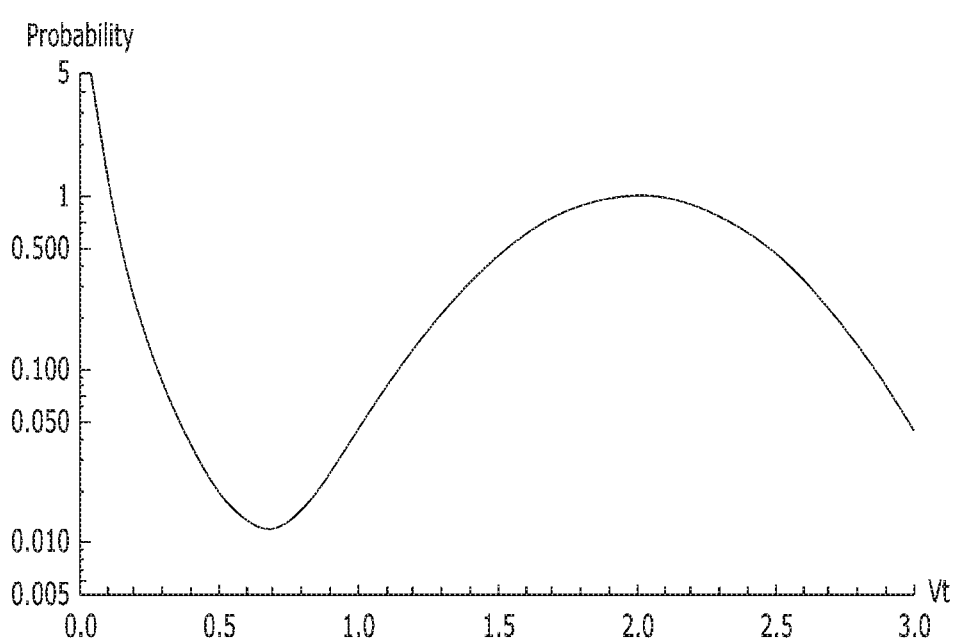
FIG. 8 illustrates an example of an overall read threshold (Vt) distribution.

In FIG. 8, a horizontal axis (i.e., x-axis) represents a read threshold value Vt and a vertical axis (i.e., y-axis) represents a probability (or a distribution on a log scale). The overall Vt distribution curve is a probability density function (PDF) of a read threshold value. In the illustrated example of FIG. 8, the overall Vt distribution curve is a mixture of a Gaussian distribution (i.e., portion of the curve to the right of Vtmin) and a Student T distribution (i.e., portion of the curve to the left of Vtmin). In this example, it is assumed that the minimum point on the Vt distribution curve (Vtmin) is at Vt=0.677 and the corresponding probability (i.e., distribution value) is 0.0121.

Referring back to FIG. 5, the read threshold optimizer 530 may obtain the multiple read threshold voltage values from the read processor 510. Further, the read threshold optimizer 530 may estimate a threshold voltage distribution curve based on the multiple read threshold voltage values.

Figure 9A:
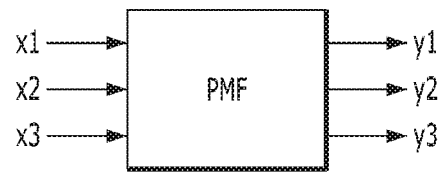
FIGS. 9A to 10 illustrate operations of a read threshold optimizer in accordance with an embodiment of the present invention.
Figure 9B:
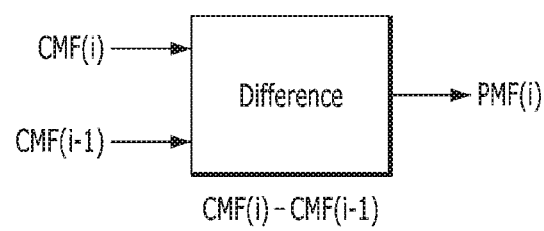

The read threshold optimizer 530 may measure probability values y=[y1, y2, y3] for the multiple read threshold voltage values x=[x1, x2, x3]. In this example, it is assumed that 3 read operations are performed. For example, x1 is a first read threshold voltage value for a first read operation, x2 is a second read threshold voltage value for a second read operation and x3 is a third read threshold voltage value for a third read operation. The Vt distribution curve for discrete read threshold voltage values may be a probability mass function (PMF) instead of PDF. Thus, the probability values y=[y1, y2, y3] may be measured using PMF for the multiple read threshold voltage values x=[x1, x2, x3] as shown in FIG. 9A. In some embodiments, PMF may be measured by a difference between two cumulative mass function (CMF) values, i.e., PMF[i]=CMF[i]−CMF[i−1] as shown in FIG. 9B. In some embodiments, for each read threshold voltage value, a CMF value may be determined based on number of cells (cell count) and the number of a particular binary value (1 or 0) among the cells, which are associated with a read operation using each read threshold voltage value. For example, each CMF value may be determined as {the number of 1's or 0's (e.g., 1's)/cell count}.

Figure 9C:
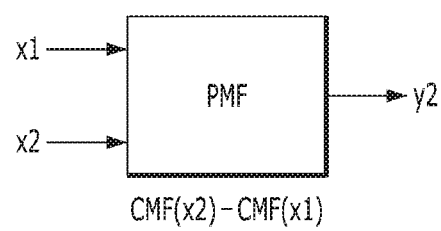

The read threshold optimizer 530 may determine a CMF value CMF(i) for a current read threshold voltage value x(i) and a CMF value CMF(i−1) for a previous read threshold voltage value x(i−1). As shown in FIG. 9B, the read threshold optimizer 530 may determine a difference (i.e., CMF (i)−CMF(i−1)) between the CMF values for the current and previous read threshold voltage values x(i), x(i−1) as a PMF probability value PMF(i) for the current read threshold voltage value x(i). For example, the read threshold optimizer 530 may determine a difference (i.e., CMF(x2)−CMF(x1)) between the CMF values for the current and previous read threshold voltage values x(2), x(1) as a PMF probability value PMF (i.e., y2) for the current read threshold voltage value x(2), as shown in FIG. 9C. Similarly, the read threshold optimizer 530 may determine a difference (i.e., CMF (x3)−CMF(x2)) between the CMF values for the current and previous read threshold voltage values x(3), x(2) as a PMF probability value PMF (i.e., y3) for the current read threshold voltage value x(3). For the current read threshold voltage value x(1), the read threshold optimizer 530 may determine a difference (i.e., CMF(x1)−0) between the CMF values for the current read threshold voltage value x(1) and the previous read threshold voltage value 0 as a PMF probability value PMF (i.e., y1). In this way, probability values of the Vt distribution may be measured. By way of example, probability values of the Vt distribution are measured at x=[0.5, 0.6, 0.7] and the measurements are y=[0.0202961, 0.0135188, 0.0122511].

Figure 10:
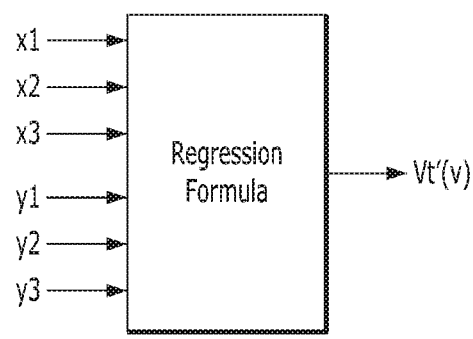

The read threshold optimizer 530 may estimate the Vt distribution curve by applying the multiple read threshold voltage values and the measured probability values to a set regression formula. In other words, the read threshold optimizer 530 may apply the set regression formula to the multiple read threshold voltage values x=[x1, x2, x3] and the measured probability values y=[y1, y2, y3], as shown in FIG. 10. In some embodiments, the set regression formula may be represented by Equation (1) shown below.

$$Vt'(v) = \sum_{i=1}^{k} \frac{y[i]\frac{1}{\sqrt{2\pi s^2}}e^{-\frac{(-x[i]+v)^2}{2s^2}}}{\sum_{j=1}^{k}\frac{1}{\sqrt{2\pi s^2}}e^{-\frac{(-x[j]+x[i])^2}{2s^2}}} \quad \text{Eq (1)}$$

The regression formula in Equation (1) may be a function of multiple read threshold voltage values x[i] and probability values y[i]. The variables of the regression formula are defined in the following List 1.

List 1:
k: the number of test reads or sample points on the Vt distribution curve. In this example above, k=3.
x[i]: the Vt value for the i-th measurement on the PMF curve.
y[i]: measurement value of PMF at Vt=x[i].
v: dummy variable of the estimated PMF.
s: scaling factor for model, which may be chosen to be 0.05.

When the set regression formula is applied to the multiple read threshold voltage values x=[0.5, 0.6, 0.7] and the measured probability values y=[0.0202961, 0.0135188, 0.0122511], the set regression formula may yield the following:

$Vt'(v)=0.0107875416233356671e^{-199.99999999999997(-0.7+v)^2}+0.010639086212795329e^{-199.99999999999997(-0.6+v)^2}+0.017871506319283945e^{-199.99999999999997(-0.5+v)^2}$

The above equation applies for an arbitrary number of test reads, and it does not rely on any pre-determined probabilistic model of Vt. It is just a function of the measurement data points x[i] and y[i]. As more data points are collected, the estimated read threshold distribution Vt'(v) gets closer to the true read threshold distribution Vt(v).

Figure 11A:
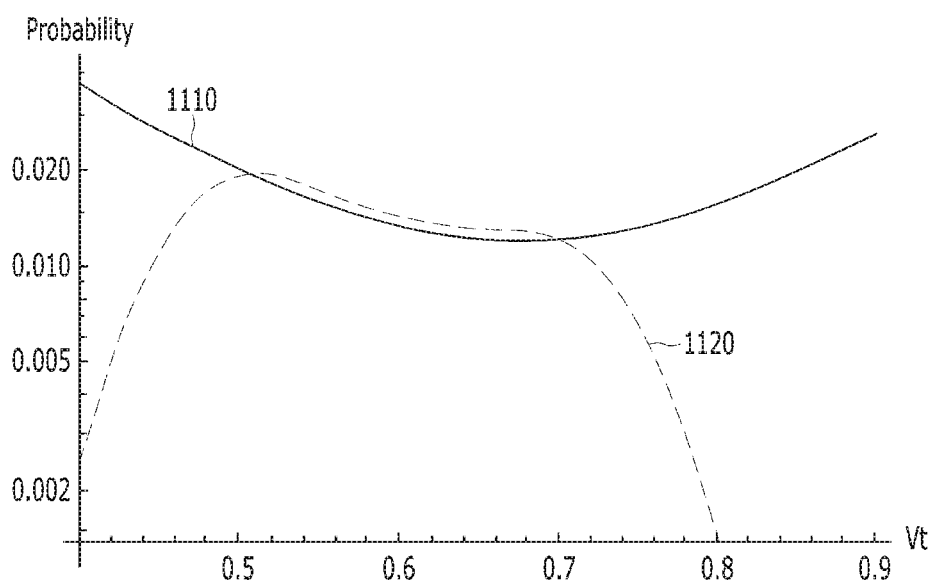
FIG. 11A illustrates a comparison between estimated and true read threshold (Vt) distributions in accordance with an embodiment of the present invention.

In FIG. 11A, an estimated Vt distribution curve 1120 is illustrated with respect to the overall Vt distribution curve 1110, which corresponds to the Vt distribution curve in FIG. 8. The Vt distribution curve 1120 is estimated with 3 read threshold voltage values x=[0.5, 0.6, 0.7].

Referring back to FIG. 5, the read threshold optimizer 530 may determine a read threshold voltage value corresponding to a set point on the threshold voltage distribution curve. For example, the read threshold optimizer 530 may determine a read threshold voltage value corresponding to a minimum point on the threshold voltage distribution curve, e.g., 1120, in FIG. 11A. In some embodiments, the read threshold optimizer 530 may evaluate the regression formula above Vt'(v) step-wise, and determines a lowest value among all points evaluated as the minimum point on the threshold voltage distribution curve 1120. The step size may be any suitable value. It is observed that the minimum point of vt'(v) is at v=0.7 and the corresponding minimum value is 0.0121. As described with respect to FIG. 8, the minimum point on the Vt distribution curve is at Vt=0.677 and the corresponding probability (i.e., distribution value) is 0.0121.

Figure 11B:
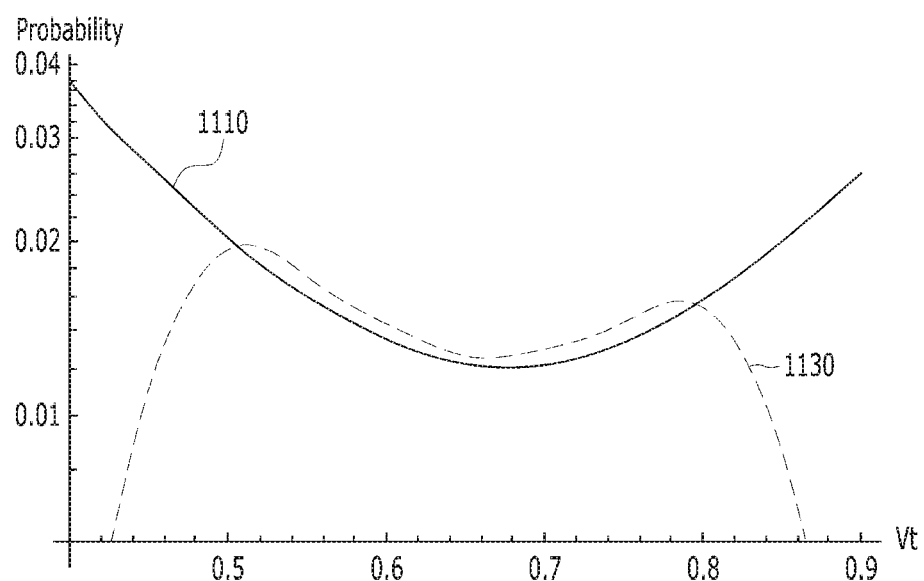
FIG. 11B illustrates a comparison between estimated and true read threshold (Vt) distributions in accordance with an embodiment of the present invention.

The read threshold optimizer 530 may estimate a Vt distribution curve with 4 read threshold voltage values x=[0.5, 0.6, 0.7, 0.8]. By way of example, probability values of the Vt distribution are measured at x=[0.5, 0.6, 0.7, 0.8] and the measurements are y=[0.0202961, 0.0135188, 0.0122511, 0.0159058]. When the set regression formula above is applied to the multiple read threshold voltage values x=[0.5, 0.6, 0.7, 0.8] and the measured probability values y=[0.0202961, 0.0135188, 0.0122511, 0.0159058], a Vt distribution curve 1130 is estimated as shown in FIG. 11B. In FIG. 11B, the estimated Vt distribution curve 1130 is illustrated with respect to the overall Vt distribution curve 1110 in FIG. 8. It is observed that the minimum point of Vt'(v) is at v=0.66 and the corresponding minimum value is 0.01225. As described with respect to FIG. 8, the minimum point on the Vt distribution curve is at Vt=0.677 and the corresponding probability (i.e., distribution value) is 0.0121. As can be seen from FIGS. 11A and 11B, as more test reads are performed, the estimated Vt'(v) is getting close to the actual Vt(v) in FIG. 8.

Figure 12:
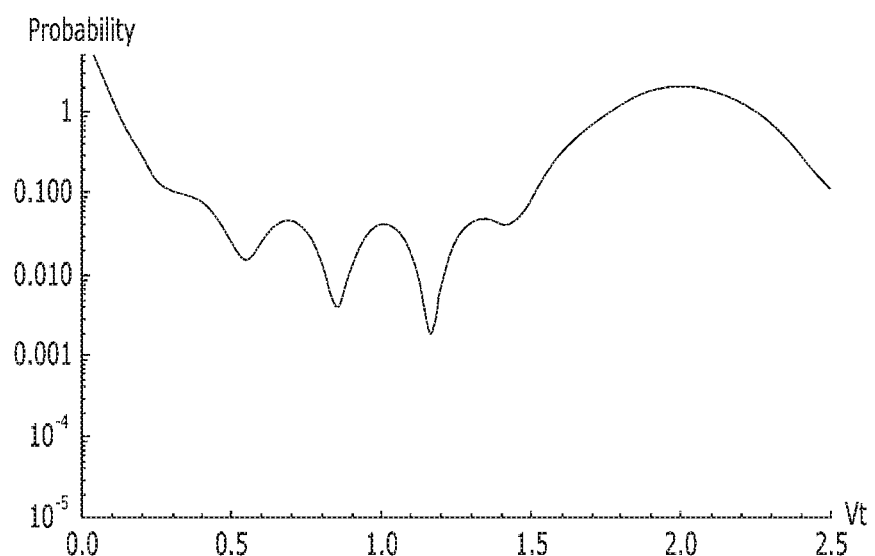
FIG. 12 illustrates an example of an overall read threshold (Vt) distribution.
Figure 13:
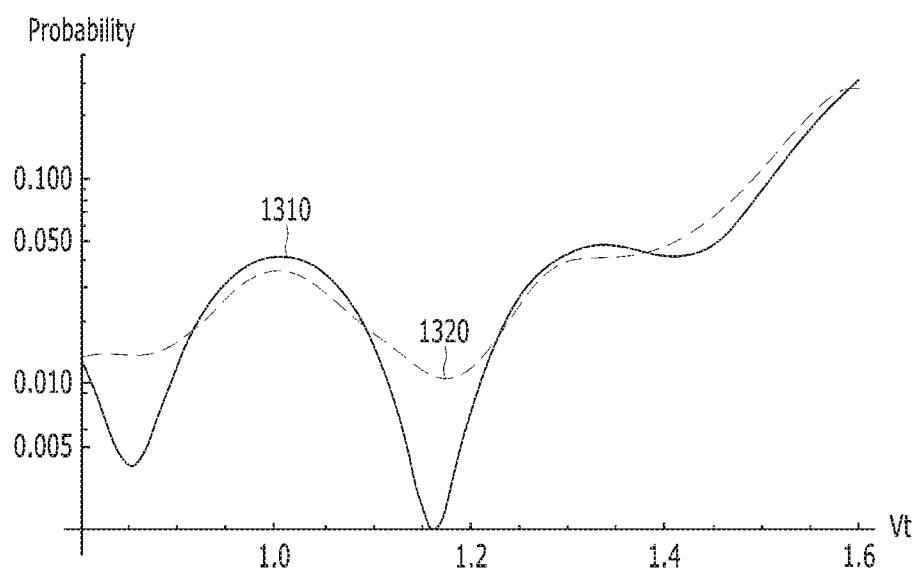
FIG. 13 illustrates a comparison between estimated and true read threshold (Vt) distributions in accordance with an embodiment of the present invention.

Embodiments may be applied to an overall read threshold (Vt) distribution with noise, as shown in FIG. 12 which illustrates a noisy Vt distribution. In this example, the gradient decent based algorithm may easily be trapped at one of the local minimum points. The read threshold optimizer 530 may estimate a Vt distribution curve with 9 read threshold voltage values x=[0.8, 0.9, 1.0, 1.1, 1.2, 1.3, 1.4, 1.5, 1.6]. By way of example, probability values of the Vt distribution are measured at x=[0.8, 0.9, 1.0, 1.1, 1.2, 1.3, 1.4, 1.5, 1.6] and the measurements are y=[0.0138716, 0.0127417, 0.0423129, 0.0161038, 0.00714726, 0.0437911, 0.0428013, 0.0903059, 0.305872]. When the set regression formula above is applied to the multiple read threshold voltage values x=[0.8, 0.9, 1.0, 1.1, 1.2, 1.3, 1.4, 1.5, 1.6] and the measured probability values y=[0.0138716, 0.0127417, 0.0423129, 0.0161038, 0.00714726, 0.0437911, 0.0428013, 0.0903059, 0.305872], a Vt distribution curve 1320 is estimated as shown in FIG. 13. In FIG. 13, the estimated Vt distribution curve 1320 is illustrated with respect to the overall Vt distribution curve 1310, which corresponds to the Vt distribution curve in FIG. 12. It is observed that the minimum point of the estimated Vt distribution curve 1320 is at v=1.175 while the true minimum value of the overall Vt distribution curve 1310 is at 1.163.

Figure 14:
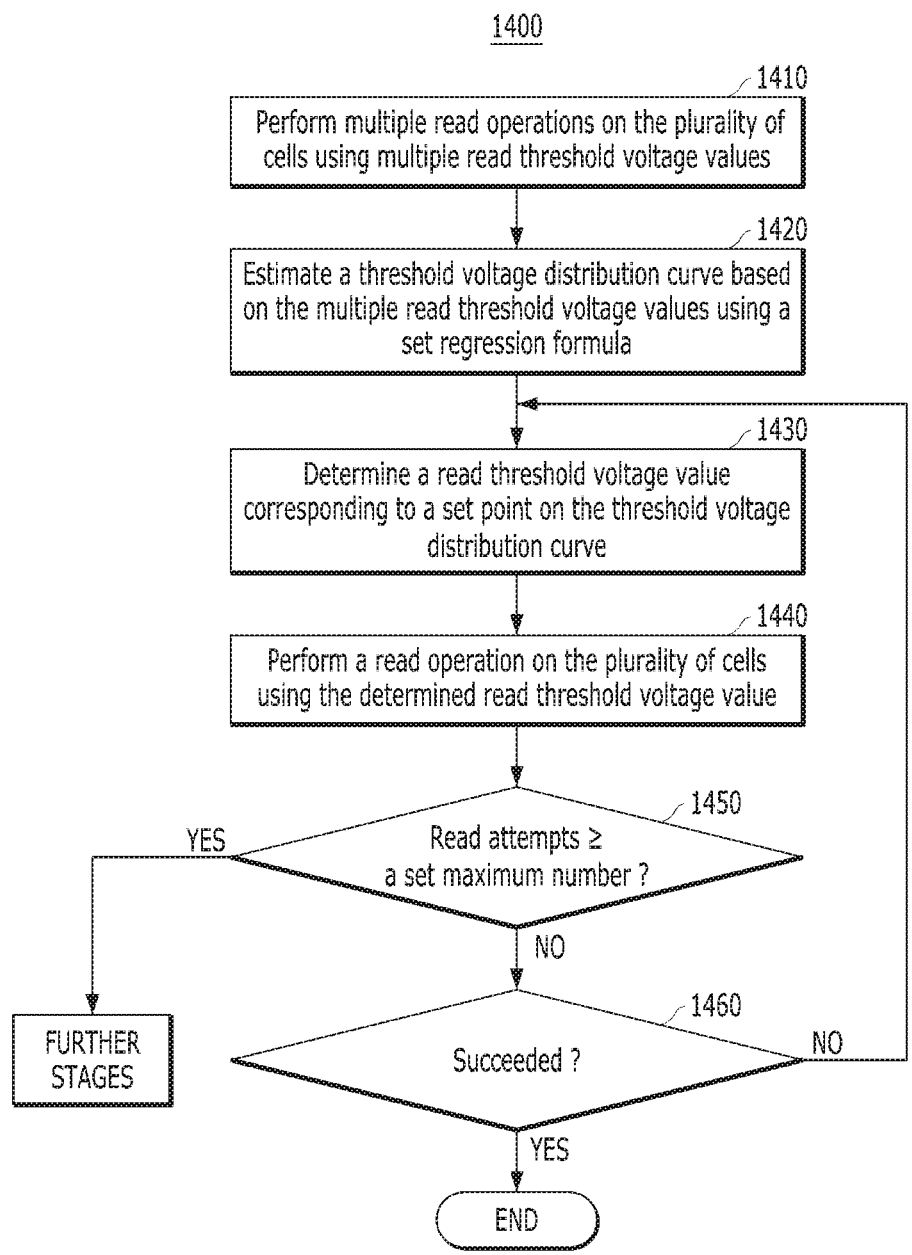
FIG. 14 is a flowchart illustrating a read threshold optimization operation in accordance with an embodiment of the present invention.

FIG. 14 is a flowchart illustrating a read threshold optimization operation 1400 in accordance with an embodiment of the present invention. The read threshold optimization operation 1400 may be performed by the read processor 510, the decoder 520 and the read threshold optimizer 530 of the controller 100 in FIG. 5.

Referring to FIG. 14, in operation 1410, the read processor 510 may perform multiple read operations on the plurality of cells using multiple read threshold voltage values.

In some embodiments, the read processor 510 may perform a first read operation on the plurality of cells using a first read threshold voltage value, and may perform a second read operation on the plurality of cells using a second read threshold voltage value. In some embodiments, the first read threshold voltage value may be a successful, previous-used read threshold voltage value (i.e., a history read threshold voltage value), and the second read threshold may be used for a read retry operation. The second read threshold may have a high (or the highest) priority among multiple read retry threshold voltage values, which are stored in a read retry table for the read retry operation.

In operation 1420, the read threshold optimizer 530 may estimate a threshold voltage distribution curve based on the multiple read threshold voltage values using a set regression formula.

In some embodiments, the read threshold optimizer 530 may measure probability values for the multiple read threshold voltage values using a probability mass function (PMF). Further, the read threshold optimizer 530 may estimate the threshold voltage distribution curve by applying the set regression formula to the multiple read threshold voltage values and the measured probability values.

In some embodiments, the read threshold optimizer 530 may determine cumulative mass function (CMF) values for a current read threshold voltage value and a previous read threshold voltage value. Further, the read threshold optimizer 530 may determine a difference between the CMF values for the current and previous read threshold voltage values as a PMF probability value for the current read threshold voltage value. For example, for each read threshold voltage value, each CMF value may be determined based on the number of cells and the number of a particular binary value (0 or 1) among those cells, which are associated with a read operation using each read threshold voltage value.

In some embodiments, the set regression formula may include a function of multiple read threshold voltage values and probability values. The read threshold optimizer 530 may estimate the threshold voltage distribution curve by applying the set regression formula to the multiple read threshold voltage values and the measured probability values.

In some embodiments, the read threshold optimizer 530 may evaluate the set regression formula in steps, the size of which may be any suitable value, and may determine a lowest value among all points evaluated as the set point on the threshold voltage distribution curve.

In operation 1430, the read threshold optimizer 530 may determine a read threshold voltage value corresponding to a set point on the threshold voltage distribution curve.

In operation 1440, the read processor 510 may perform a read operation on the plurality of cells using the determined read threshold voltage value.

In operation 1450, the read processor 510 may determine whether the number of read operations performed, i.e., read attempts, has reached a set maximum number. When the number of read attempts performed thus far is less than the set maximum number, the process may proceed to further stages (e.g., other read threshold search). When it is determined that the number of read attempts performed has reached the set maximum number, the read processor 510 may determine, in operation 1460, whether the read operation using the determined read threshold voltage value succeeded or failed, depending on the decoding result of the decoder 520.

When the read operation using the determined read threshold voltage value failed, the process may return to the operation 1430, where another read threshold voltage value is determined from the distribution curve. When the read operation using the determined read threshold voltage value succeeded, the read threshold optimization operation 1400 ends.

As described above, embodiments provide a scheme for optimizing a read threshold value of a memory system using model-less regression. The scheme uses the model-less regression instead of model-based schemes such as GM or curve-fitting algorithms. Thus, embodiments may be easy to implement and improve the read threshold prediction accuracy and hence improve the endurance and QoS of memory systems (e.g., SSDs).

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
a memory device including a plurality of cells; and
a controller, coupled to the memory device, configured to:
perform multiple read operations on the plurality of cells using multiple read threshold voltage values;
measure probability values for the multiple read threshold voltage values;
estimate a threshold voltage distribution curve based on the multiple read threshold voltage values and the measured probability values using a set regression formula;
determine a read threshold voltage value corresponding to a set point on the threshold voltage distribution curve; and
perform a read operation on the plurality of cells using the read threshold voltage value.

2. The memory system of claim 1, wherein the controller is configured to:
perform a first read operation, of the multiple read operations, on the plurality of cells using a first read threshold voltage value; and
perform a second read operation, of the multiple read operations, on the plurality of cells using a second read threshold voltage value.

3. The memory system of claim 2, wherein the first read threshold voltage value includes a successful, previously-used read threshold voltage value.

4. The memory system of claim 2, wherein the second read threshold is used for a read retry operation.

5. The memory system of claim 4, wherein the second read threshold value has a high priority among multiple read retry threshold voltage values, which are stored in a read retry table for the read retry operation.

6. The memory system of claim 1, wherein the controller:
measures probability values for the multiple read threshold voltage values using a probability mass function (PMF); and
estimates the threshold voltage distribution curve by applying the set regression formula to the multiple read threshold voltage values and the measured probability values.

7. The memory system of claim 6, wherein the controller:
determines a cumulative mass function (CMF) values for a current read threshold voltage value and a previous read threshold voltage value; and
determines a difference between the CMF values for the current and previous read threshold voltage values as a PMF probability value for the current read threshold voltage value.

8. The memory system of claim 7, wherein each CMF value is determined based on a number of cells and the number of a particular binary value among the cells, which are associated with a read operation using each read threshold voltage value.

9. The memory system of claim 6, wherein the set regression formula includes a function of multiple read threshold voltage values and probability values, and wherein the controller estimates the threshold voltage distribution curve by applying the set regression formula to the multiple read threshold voltage values and the measured probability values.

10. The memory system of claim 9, wherein the controller evaluates the set regression formula in steps, each of which has a set uniform size, and determines a lowest value among all points evaluated as the set point on the threshold voltage distribution curve.

11. A method for operating a memory system comprising:
performing multiple read operations on a plurality of cells using multiple read threshold voltage values;
measuring probability values for the multiple read threshold voltage values;
estimating a threshold voltage distribution curve based on the multiple read threshold voltage values and the measured probability values using a set regression formula;
determining a read threshold voltage value corresponding to a set point on the threshold voltage distribution curve; and
performing a read operation on the plurality of cells using the read threshold voltage value.

12. The method of claim 11, wherein the performing of the multiple read operations comprises:
performing a first read operation, of the multiple read operations, on the plurality of cells using a first read threshold voltage value; and
performing a second read operation, of the multiple read operations, on the plurality of cells using a second read threshold voltage value.

13. The method of claim 12, wherein the first read threshold voltage value is a successful, previously-used read threshold voltage value.

14. The method of claim 12, wherein the second read threshold is used for a read retry operation.

15. The method of claim 14, wherein the second read threshold has a high priority among multiple read retry threshold voltage values, which are stored in a read retry table for the read retry operation.

16. The method of claim 11, wherein the measuring of the probability values comprises measuring the probability values for the multiple read threshold voltage values using a probability mass function (PMF), and wherein the estimating of the threshold voltage distribution curve comprises estimating the threshold voltage distribution curve by applying the set regression formula to the multiple read threshold voltage values and the measured probability values.

17. The method of claim 16, wherein the measuring of the probability values comprises:
determining a cumulative mass function (CMF) values for a current read threshold voltage value and a previous read threshold voltage value; and
determining a difference between the CMF values for the current and previous read threshold voltage values as a PMF probability value for the current read threshold voltage value.

18. The method of claim 17, wherein each CMF value is determined based on a number of cells and the number of a particular binary value among the cells, which are associated with a read operation using each read threshold voltage value.

19. The method of claim 16, wherein the set regression formula includes a function of multiple read threshold voltage values and probability values, and wherein the estimating of the threshold voltage distribution curve includes applying the set regression formula to the multiple read threshold voltage values and the measured probability values.

20. The method of claim 19, wherein the determining of the read threshold voltage value comprises:
evaluating the set regression formula in steps, each of which a set uniform size; and
determining a lowest value among all points evaluated as the set point on the threshold voltage distribution curve.

* * * * *